United States Patent
Hatasako et al.

(10) Patent No.: US 10,950,776 B2
(45) Date of Patent: Mar. 16, 2021

(54) THERMOELECTRIC POWER GENERATION DEVICE

(71) Applicant: Yanmar Co., Ltd., Osaka (JP)

(72) Inventors: Yoshika Hatasako, Osaka (JP); Jiro Fukudome, Osaka (JP); Yuichiro Tanaka, Osaka (JP); Shuichi Nakagawa, Osaka (JP)

(73) Assignee: YANMAR POWER TECHNOLOGY CO., LTD., Osaka (JP)

( * ) Notice: Subject to any disclaimer, the term of this patent is extended or adjusted under 35 U.S.C. 154(b) by 40 days.

(21) Appl. No.: 16/344,735

(22) PCT Filed: Sep. 27, 2017

(86) PCT No.: PCT/JP2017/034917
§ 371 (c)(1),
(2) Date: Apr. 24, 2019

(87) PCT Pub. No.: WO2018/079170
PCT Pub. Date: May 3, 2018

(65) Prior Publication Data
US 2019/0334073 A1    Oct. 31, 2019

(30) Foreign Application Priority Data
Oct. 25, 2016   (JP) .............................. JP2016-208954

(51) Int. Cl.
*H01L 35/30* (2006.01)
*F01N 5/02* (2006.01)
(Continued)

(52) U.S. Cl.
CPC .............. *H01L 35/30* (2013.01); *F01N 5/025* (2013.01); *F02G 5/02* (2013.01); *H01L 35/32* (2013.01)

(58) Field of Classification Search
CPC .......... H01L 35/30; H01L 35/32; F01N 5/025
See application file for complete search history.

(56) References Cited

U.S. PATENT DOCUMENTS

| 8,445,772 B2 * | 5/2013 | Bell .......................... F01P 9/06 136/205 |
| 2010/0095996 A1 | 4/2010 | Bell et al. |

(Continued)

FOREIGN PATENT DOCUMENTS

| JP | 2008-546954 A | 12/2008 |
| JP | 2013-090526 A | 5/2013 |

(Continued)

OTHER PUBLICATIONS

International Search Report dated Dec. 12, 2017 issued in corresponding PCT Application PCT/JP2017/034917 cites the patent documents above.

*Primary Examiner* — Golam Mowla
(74) *Attorney, Agent, or Firm* — Norton Rose Fulbright US LLP (57) ABSTRACT

A thermoelectric power generation device including: a heating unit having a heat medium passage in which a heat medium flows, a cooling unit having a cooling liquid passage in which a cooling liquid flows, a thermoelectric element having the heating unit on one side and the cooling unit on another side, the thermoelectric element configured to generate power by utilizing a temperature difference between a condensation temperature of the heat medium that undergoes latent heat transfer in the heat medium passage and a temperature of the cooling liquid; and the thermoelectric power generation device further including a heat medium adjusting unit configured to adjust the pressure or the temperature of the heat medium.

14 Claims, 6 Drawing Sheets

(51) Int. Cl.
*H01L 35/32* (2006.01)
*F02G 5/02* (2006.01)

(56) References Cited

U.S. PATENT DOCUMENTS

2013/0213450 A1   8/2013   Kannari et al.
2015/0068575 A1   3/2015   Komitsu

FOREIGN PATENT DOCUMENTS

| | | |
|---|---|---|
| JP | 2013-169092 A | 8/2013 |
| JP | 2013-208002 A | 10/2013 |
| JP | 2015-012173 A | 1/2015 |
| WO | 2013/114428 A1 | 8/2013 |

* cited by examiner

THERMOELECTRIC POWER GENERATION DEVICE

CROSS REFERENCES TO RELATED APPLICATIONS

This application is a national stage application pursuant to 35 U.S.C. § 371 of International Application No. PCT/JP2017/034917, filed on Sep. 27, 2017, which claims priority under 35 U.S.C. § 119 to Japanese Patent Application No. 2016-208954, filed on Oct. 25, 2016, the disclosures of which are hereby incorporated by reference in their entireties

TECHNICAL FIELD

The present invention relates to a thermoelectric power generation device including a thermoelectric element which generates power by utilizing a temperature difference.

BACKGROUND ART

An example of such a type of traditional thermoelectric power generation device is disclosed in Patent Literature 1 (hereinafter referred to as PTL 1). PTL 1 discloses a thermoelectric power generation device including a heating unit having a heat medium passage on one surface of a thermoelectric element and a cooling unit having a coolant passage on the other surface of the thermoelectric element, the device being configured to generate power by utilizing a temperature difference between a heat medium flowing in the heat medium passage and a coolant flowing in the coolant passage.

CITATION LIST

Patent Literature

PTL 1: Japanese Patent Application Laid-Open No. 2015-012173

SUMMARY OF INVENTION

Technical Problem

However, the thermoelectric power generation device of PTL 1, still leaves a room for improvement in terms of improving the power generation amount.

The present invention is to achieve the above object and provides a thermoelectric power generation device that can improve the power generation amount.

Solution to Problem

A thermoelectric power generation device related to an aspect of the present invention includes: a heating unit having a heat medium passage in which a heat medium flows;

a cooling unit having a cooling liquid passage in which a cooling liquid flows;

a thermoelectric element having the heating unit on one side and the cooling unit on another side, the thermoelectric element configured to generate power by utilizing a temperature difference between a condensation temperature of the heat medium that undergoes latent heat transfer in the heat medium passage and a temperature of the cooling liquid, the thermoelectric power generation device further including a heat medium adjusting unit configured to adjust a pressure or a temperature of the heat medium.

Advantageous Effects of Invention

The thermoelectric power generation device of the above aspect of the present invention can improve the power generation amount.

DESCRIPTION OF EMBODIMENTS (Findings on which the present invention is based)

As a result of extensive studies for improving the power generation amount, the inventors of the present invention have obtained the following findings.

In a traditional thermoelectric power generation device such as the one disclosed in PTL 1, a high-temperature liquid or gas is supplied as a heat medium into a heat medium passage. In such a structure, the heat medium flowing in the heat medium passage is in the same phase, and therefore the heat medium undergoes sensible heat transfer. In other words, the temperature of the heat medium changes while it flows in the heat medium passage.

Meanwhile, the inventors of the present invention have found that, by causing a phase transition of the heat medium (e.g. from gas to liquid) while the heat medium flows in the heat medium passage, the temperature of the heat medium can be constant and the power generation amount can be improved. In other words, during the latent heat transfer of the heat medium, the condensation temperature of the heat medium is constant, and by utilizing this, the inventors of the present invention have found that the power generation amount can be improved.

Further, the inventors of the present invention have newly found that, in cases of utilizing the heat medium that undergoes latent heat transfer in the heat medium passage, it is important to control the pressure of the heat medium for improving the power generation amount. For example, an excessive increase in the pressure of the heat medium leads to distortion in the thermoelectric power generation device. This damages the heat medium passage or the thermoelectric element. To the contrary, an excessive drop in the pressure of the heat medium causes a drop in the saturation temperature of the heat medium, which may lead to an insufficient temperature difference between both sides of the thermoelectric element. As a result, the power generation amount may drop. In this regard, since the pressure of the heat medium has a proportional relation with the temperature of the heat medium, the inventors of the present invention have found that the pressure of the heat medium can be practically controlled by controlling the temperature of the heat medium. Based on these findings, the inventors of the present invention have arrived at the following invention.

A thermoelectric power generation device related to an aspect of the present invention includes:

a heating unit having a heat medium passage in which a heat medium flows, a cooling unit having a cooling liquid passage in which a cooling liquid flows;

a thermoelectric element having the heating unit on one side and the cooling unit on another side, the thermoelectric element configured to generate power by utilizing a temperature difference between a condensation temperature of the heat medium that undergoes latent heat transfer in the heat medium passage and a temperature of the cooling liquid, the thermoelectric power generation device further including a heat medium adjusting unit configured to adjust a pressure or a temperature of the heat medium.

With this structure having the heat medium adjusting unit configured to adjust the pressure or the temperature of the heat medium that undergoes latent heat transfer in the heat medium passage, for example, an excessive increase in the pressure of the heat medium can be suppressed or reduced, and damages to the heat medium passage or the thermoelectric element can be suppressed or reduced. Further, for example, by suppressing or reducing an excessive drop in the pressure of the heat medium, the condensation pressure of the heat medium can be maintained and a sufficient temperature difference between both sides of the thermoelectric element can be achieved. As a result, the power generation amount can be improved.

The heat medium adjusting unit may be configured to adjust the pressure or the temperature in the heat medium passage, so that the pressure or the temperature in the heat medium passage does not exceed a predetermined upper limit value.

For example, the heat medium adjusting unit may include a heat medium storage tank configured to store the heat medium, a heat medium pipe connecting the heat medium passage with the heat medium storage tank, a valve body configured to open and close the heat medium pipe, and a pressure detection unit configured to detect the pressure of the heat medium or a temperature detection unit configured to detect the temperature of the heat medium; and the heat medium adjusting unit may be configured to open the valve body to let the heat medium in the heat medium passage partially flow into the heat medium storage tank, so that the pressure detected by the pressure detection unit or the temperature detected by the temperature detection unit does not exceed the predetermined upper limit value.

Further, the heat medium adjusting unit may include a heat exchanger configured to perform heat exchanging with respect to the heat medium, and the heat exchanger may be configured to perform heat exchanging with respect to the heat medium to reduce the pressure or the temperature of the heat medium when the pressure or the temperature in the heat medium passage exceeds a predetermined upper limit value.

Further, the heat medium adjusting unit may include a cooling pipe passing through the heating unit, and may be configured to reduce the pressure or the temperature in the heat medium passage by letting a coolant flow into the cooling pipe when the pressure or the temperature in the heat medium passage exceeds a predetermined upper limit value.

Further, the heat medium adjusting unit may include a branch pipe branching from a cooling liquid inflow pipe through which the cooling liquid is introduced into the cooling liquid passage, a valve body that opens and closes the branch pipe, a pressure detection unit configured to detect the pressure of the heat medium or a temperature detection unit configured to detect the temperature of the heat medium; and the heat medium adjusting unit may be configured to open the valve body to let the cooling liquid partially flow as the coolant through the branch pipe into the cooling pipe when a pressure detected by the pressure detection unit or the temperature detected by the temperature detection unit exceeds the predetermined upper limit value.

These structures can suppress or reduce an excessive increase in the pressure of the heat medium, and can suppress or reduce damages to the heat medium passage and the thermoelectric element. As a result, the power generation amount can be improved.

The heat medium adjusting unit may be configured to adjust the pressure or the temperature in the heat medium passage, so that the pressure or the temperature in the heat medium passage does not fall short of a predetermined lower limit value.

For example, the heat medium adjusting unit may include a heat medium storage tank configured to store the heat medium, a heat medium pipe connecting the heat medium passage with the heat medium storage tank, a pressure detection unit configured to detect the pressure of the heat medium or a temperature detection unit configured to detect the temperature of the heat medium; and the heat medium adjusting unit may be configured to let the heat medium in the heat medium storage tank flow into the heat medium passage through the heat medium pipe, so that the pressure detected by the pressure detection unit or the temperature detected by the temperature detection unit does not fall short of the predetermined lower limit value.

The heat medium adjusting unit may include a pump configured to pressure-feed the heat medium in the heat medium storage tank to the heat medium passage.

Further, the heat medium adjusting unit may include a heat medium storage tank configured to store the heat medium, a heat medium pipe connecting the heat medium passage with the heat medium storage tank, a valve body configured to open and close the heat medium pipe, and a pressure detection unit configured to detect the pressure of the heat medium or a temperature detection unit configured to detect the temperature of the heat medium; and the heat medium adjusting unit may be configured to open the valve body to let the heat medium in the heat medium storage tank flow into the heat medium passage through the heat medium pipe, so that the pressure detected by the pressure detection unit or the temperature detected by the temperature detection unit does not fall short of the predetermined lower limit value.

Further, the heat medium adjusting unit may include a heater for heating the heat medium stored in the heat medium storage tank, and the heater may be configured to heat the heat medium so that the pressure or temperature of the heat medium stored in the heat medium storage tank is higher than the pressure or the temperature in the heat medium passage.

These structures can suppress or reduce an excessive decrease in the pressure of the heat medium, to maintain the condensation pressure of the heat medium, and to achieve a sufficient temperature difference between both surfaces of the thermoelectric element. As a result, the power generation amount can be improved.

The following describes embodiments with reference to attached drawings. In each of the drawings, elements are exaggerated for the sake of easier understanding.

Embodiment 1

[Overall Structure]

An overall structure of a thermoelectric power generation device related to Embodiment 1 is described.

Figure 1A:
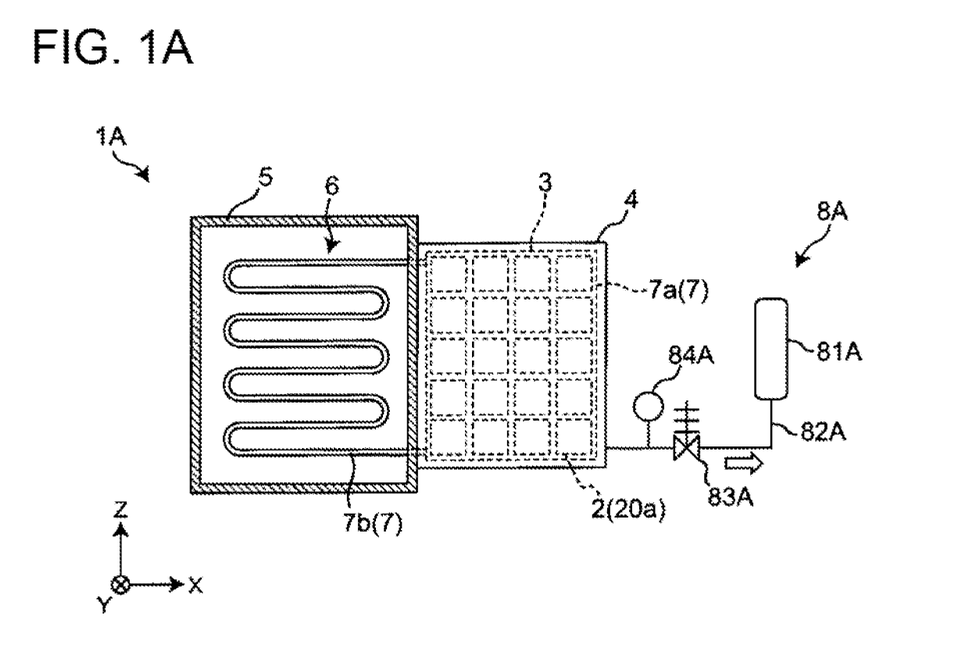
FIG. 1A A diagram showing a schematic structure of a thermoelectric power generation device related to Embodiment 1 of the present invention.
Figure 1B:
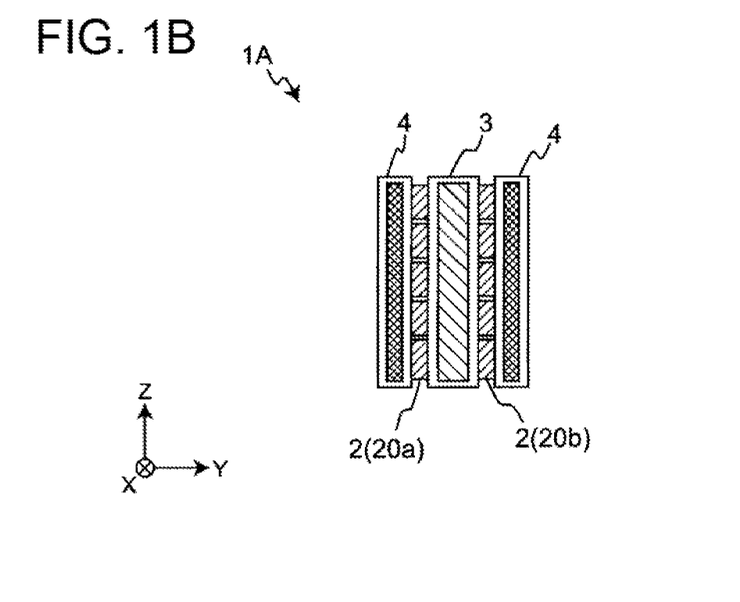
FIG. 1B A diagram showing a schematic structure of the thermoelectric power generation device related to Embodiment 1 of the present invention as viewed from behind.

FIG. 1A shows a schematic structure of a thermoelectric power generation device 1A related to Embodiment 1. The directions X, Y, and Z in FIG. 1A indicate the longitudinal direction, lateral direction, and the height direction of the thermoelectric power generation device 1A, respectively. The longitudinal direction, the lateral direction, and the height direction mean the length direction, short direction, and the up-down direction of the thermoelectric power generation device 1A, respectively. FIG. 1B is a diagram showing a schematic structure of the thermoelectric power generation device 1A as viewed from behind (in X direction).

As shown in FIG. 1A and FIG. 1B, the thermoelectric power generation device 1A includes a thermoelectric element 2 in which a heating unit 3 is provided on one surface and a cooling unit 4 is provided on the other surface. In Embodiment 1, the thermoelectric elements 2 are provided on both sides of the heating unit 3, and the cooling units 4 are provided on both sides of the heating unit 3 so as to face each other across the thermoelectric elements 2. In Embodiment 1, the heating unit 3 is connected to a heat transfer pipe 6 arranged in a flow path 5 in which a high temperature fluid flows. Further, the heating unit 3 is connected to the heat medium adjusting unit 8A.

<Thermoelectric Element>

The thermoelectric element 2 is an element having two surfaces, i.e., one surface on which the heating unit 3 is provided (the high-temperature side) and the other surface on which the cooling unit 4 is provided (on the low-temperature side). In the thermoelectric element 2, the heating unit 3 heats the one surface and the cooling unit 4 cools the other surface, thereby generating power using the temperature difference. The thickness of the thermoelectric element 2 is designed to be smaller than the size (width) of the first side and the second side of the thermoelectric element 2. Specifically, the thermoelectric element 2 is formed in a plate shape. In Embodiment 1, thermoelectric modules 20a and 20b each having a plurality of serially connected thermoelectric elements 2 are attached to both sides of the heating unit 3. Specifically, on both sides of the heating unit 3, the thermoelectric modules 20a, 20b each having 20 thermoelectric elements 2 of four columns x five rows are attached. The number of thermoelectric elements 2 is not limited to this. For example, the thermoelectric power generation device 1A may have one thermoelectric element 2 attached to each of both sides of the heating unit 3.

<Heating Unit>

The heating unit 3 is made of a metal material with excellent thermal conductivity. The heating unit 3 is formed in a plate shape, which contacts first sides of the thermoelectric elements 2. The heating unit 3 is connected to the heat transfer pipe 6. The heating unit 3 and the heat transfer pipe 6 have internal spaces 7a, 7b communicating with each other. In the internal space 7a of the heating unit 3 and the internal space 7b of the heat transfer pipe 6, a heat medium is enclosed. Further, the internal space 7a of the heating unit 3 and the internal space 7b of the heat transfer pipe 6 form a circulation path 7 in which the heat medium is circulated.

The heat transfer pipe 6 is arranged in the flow path 5 and vaporizes the heat medium flowing in the internal space 7b which is a part of the circulation path 7, by using the heat of the high temperature fluid flowing in the flow path 5. That is, the heat transfer pipe 6 functions as a vaporizing unit for vaporizing the heat medium. The heating unit 3 condenses the heat medium vaporized in the internal space 7b of the heat transfer pipe 6. That is, the heating unit 3 functions as a condensing unit for condensing the heat medium. In Embodiment 1, water is used as the heat medium. Further, the flow path 5 is an exhaust gas duct of an engine in which high-temperature exhaust gas flows. In the flow path 5, the high temperature fluid flows in a direction towards the paper surface of FIG. 1A, i.e., in the Y direction. The flow path 5 may be, for example, a high-temperature environment such as an industrial waste furnace or a biomass boiler, or a radiation field not requiring convection, in addition to the exhaust gas duct of an engine.

Figure 2:
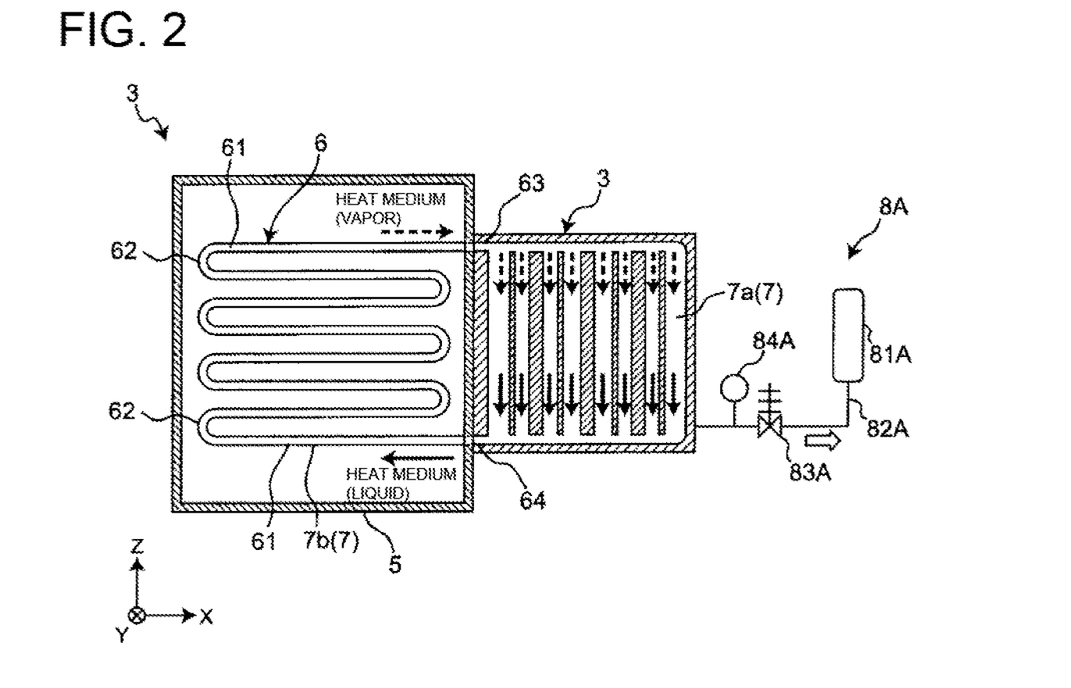
FIG. 2 A diagram showing a schematic structure of a heating unit of the thermoelectric power generation device related to Embodiment 1 of the present invention.

FIG. 2 shows a schematic structure of the heating unit 3 and the heat transfer pipe 6 of the thermoelectric power generation device 1A. As shown in FIG. 2, the heat transfer pipe 6 is structured so as to have a large contact area with the high temperature fluid flowing in the flow path 5, when viewed in the direction in which the high temperature fluid flows, i.e., the Y direction. Specifically, the heat transfer pipe 6 has a plurality of tubular members 61 extending in the X direction and a plurality of bent portions 62 connecting the tubular members 61 to each other, as viewed from the Y direction. The plurality of tubular members 61 are arranged with a predetermined interval in the Z direction and their end portions are connected through the bent portions 62, when viewed in the Y direction. With the plurality of tubular members 61 connected through the bent portions 62 as described, the heat transfer pipe 6 forms a continuous pipe having a plurality of bent portions.

In the internal space 7a of the heating unit 3, a heat medium passage in which the heat medium flows is formed. In Embodiment 1, the heat medium passage is formed so that the heat medium spreads throughout the entire heating surface of the thermoelectric element 2. Specifically, as shown in FIG. 2, a plurality of heat medium passages extending in the Z direction are formed in the internal space 7a of the heating unit 3. The heat medium passages in the internal space 7a of the heating unit 3 may be, for example, inclined towards the X direction, as long as the heat medium flows in the direction of gravity.

<Circulation Path>

The circulation path 7 is formed through the internal space 7a of the heating unit 3 and the internal space 7b of the heat transfer pipe 6. The heat medium circulates in the internal space 7a of the heating unit 3 and the internal space 7b of the heat transfer pipe 6. Specifically, when the heat transfer pipe 6 is heated by the high temperature fluid flowing in the flow path 5, the liquid heat medium flowing in the heat transfer pipe 6 is turned into vapor. In other words, the heat medium is vaporized in the internal space 7b of the heat transfer pipe 6 and the phase of the heat medium changes from liquid to gas. The vapor is discharged from an opening end portion 63 in a high position of the heat transfer pipe 6 to the heat medium passage in the internal space 7a of the heating unit 3. The vapor discharged into the heat medium passage in the internal space 7a of the heating unit 3 falls in the direction of gravity while being poured onto the heating surface of the heating unit 3, and is condensed by radiating heat from the heating surface to heat the thermoelectric elements 2. In other words, the phase of the heat medium changes from gas to liquid in the internal space 7a of the heating unit 3. That is, the heat medium undergoes latent heat transfer, and the condensation temperature of the heat medium is constant. The heat medium condensed flows from an open end portion 64 in a low position of the heat transfer pipe 6 into the heat medium passage in the internal space 7b of the heat transfer pipe 6. The heat medium having flowed into the internal space 7b of the heat transfer pipe 6 is again heated by the high temperature fluid flowing into the flow path 5, and the phase of the heat medium is changed from liquid to gas. As described, the heat medium spontaneously circulates in the circulation path 7 formed by the internal space 7a of the heating unit 3 and the internal space 7b of the heat transfer pipe 6. In other words, by using the phase change of the heat medium, the heat medium is repeatedly circulated in the circulation path 7 formed by the internal space 7a of the heating unit 3 and the internal space 7b of the heat transfer pipe 6, without power of a pump and the like.

<Heat Medium Adjusting Unit>

The heat medium adjusting unit 8A is configured to adjust the pressure of the heat medium flowing in the heat medium passage in the internal space 7a of the heating unit 3. In Embodiment 2, the heat medium adjusting unit 8A is configured to adjust the pressure so that the pressure in the heat medium passage does not exceed a predetermined upper limit value. Specifically, the heat medium adjusting unit 8A includes a heat medium storage tank 81A for storing the heat medium, a heat medium pipe 82A connecting the heat medium passage and the heat medium storage tank 81A, a valve body 83A configured to open and close the heat medium pipe 82A, and a pressure detection unit 84A for detecting the pressure of the heat medium. The valve body 83A is an automatic valve such as an electrically driven motor operated valve or an electromagnetic valve. The pressure detection unit 84A is, for example, a pressure sensor.

The heat medium adjusting unit 8A opens the valve body 83A to let the heat medium in the heat medium passage partially flow out into the heat medium storage tank 81A through the heat medium pipe 82A, so that the pressure detected by the pressure detection unit 84A does not exceed a predetermined upper limit value Thus, the flow rate of the heat medium in the heat medium passage can be reduced, and the pressure in the heat medium passage can be reduced. Note that the operation of the heat medium adjusting unit 8A is controlled by a not-shown control unit.

Further, as described above, since the pressure of the heat medium has a proportional relation with the temperature of the heat medium, the pressure of the heat medium can be practically controlled by controlling the temperature of the heat medium. For this reason, the heat medium adjusting unit 8A is configured to adjust the temperature of the heat medium flowing in the heat medium passage of the heating unit 3. Specifically, the heat medium adjusting unit 8A may include a temperature detection unit that detects the temperature of the heat medium instead of the pressure detection unit 84A. In this case, for example, the heat medium adjusting unit 8A may be configured to open the valve body 83A to let the heat medium in the heat medium passage partially flow out into the heat medium storage tank 81A, so that the temperature detected by the temperature detection unit does not exceed a predetermined upper limit value.

<Cooling Unit>

The cooling units 4 are each made of a metal material with excellent thermal conductivity. The cooling units 4 are formed in a plate shape, which contact the second sides of the thermoelectric elements 2. Further, inside each of the cooling units 4, a cooling liquid passage in which a cooling liquid flows is formed.

Figure 3:
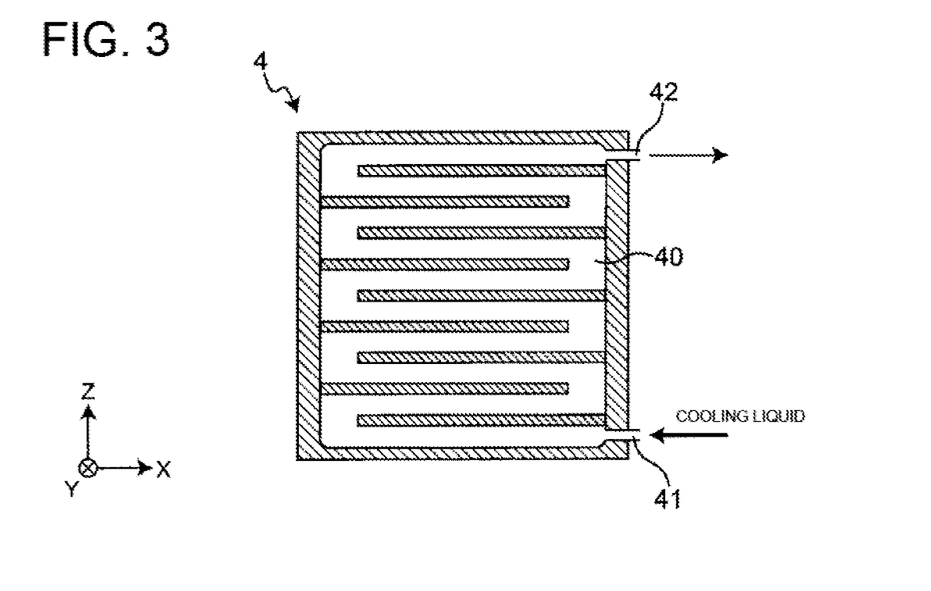
FIG. 3 A diagram showing a schematic structure of a cooling unit of the thermoelectric power generation device related to Embodiment 1 of the present invention.

FIG. 3 shows a schematic structure of the cooling unit 4 of the thermoelectric power generation device 1A. As shown in FIG. 3, inside the cooling unit 4, a plate-shape cooling liquid passage 40 is formed in such a manner that the cooling liquid is spread throughout the entire cooling surface of the cooling unit 4 which contacts the thermoelectric element 2. Specifically, the cooling liquid passage 40 has a plurality of passages extending in the X direction, which are connected with one another. The cooling liquid passage 40 is provided with a cooling liquid inflow pipe 41 on its low side, and a cooling liquid discharge pipe 42 on its high side. The cooling liquid having flowed from the cooling liquid inflow pipe 41 into the cooling liquid passage 40 cools the cooling surface in contact with the second side of the thermoelectric element 2, and then discharged from the cooling liquid discharge pipe 42. Although the cooling liquid passage 40 in Embodiment 1 is formed in a plate shape such that the cooling liquid spreads throughout the entire cooling surface in contact with the thermoelectric element 2, the shape of the cooling liquid passage 40 is not limited as long as the second side of the thermoelectric element 2 is entirely and evenly cooled. Further, the plurality of passages of the cooling liquid passage 40 inside the cooling unit 4 may extend not only in the X direction but also in the Z direction. In Embodiment 1, water is used as the cooling liquid.

<Electric System>

Figure 4:
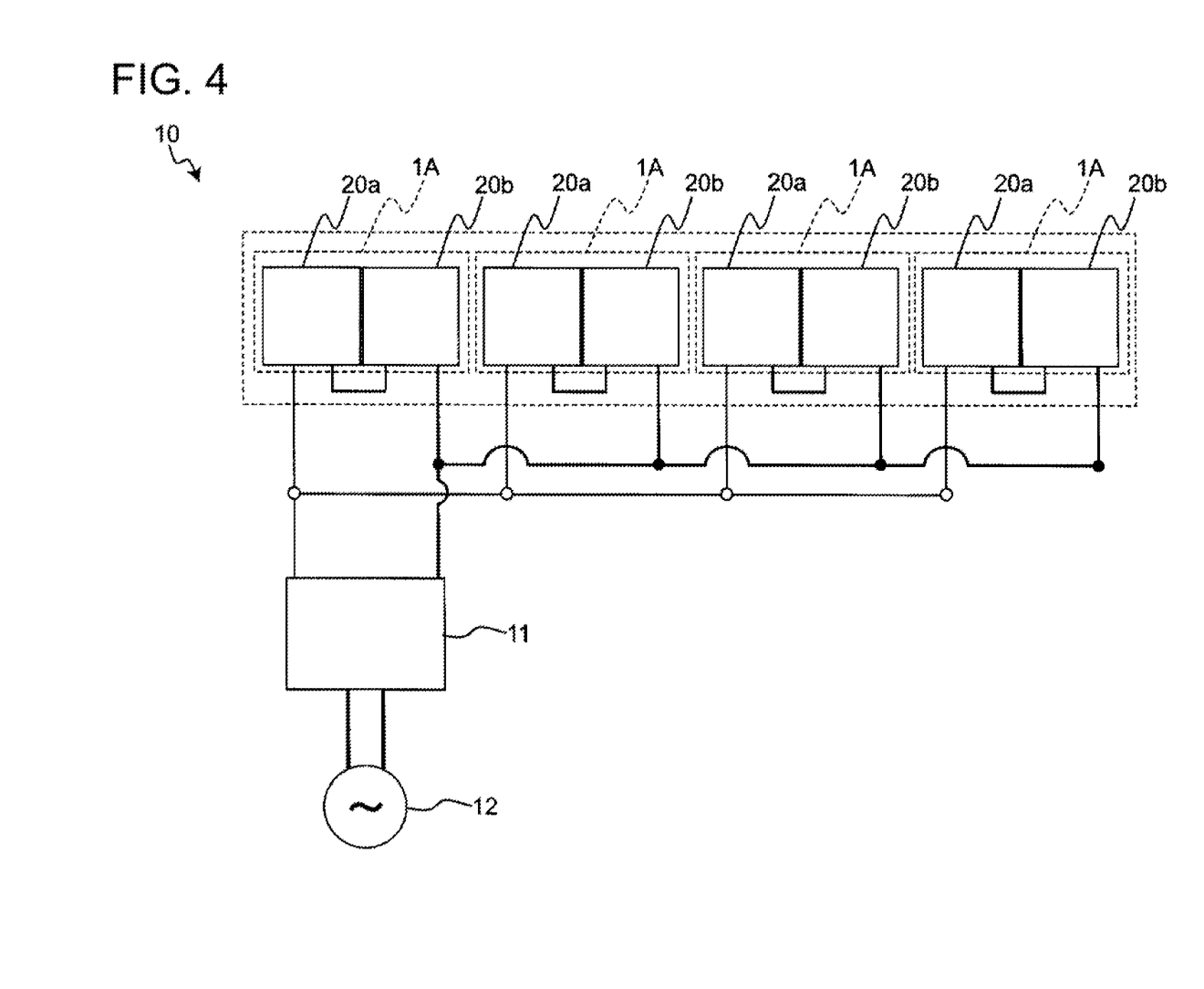
FIG. 4 A schematic diagram of an electric system of a thermoelectric power generation system using the thermoelectric power generation device related to Embodiment 1 of the present invention.

FIG. 4 is a schematic diagram of an electric system of a thermoelectric power generation system 10 using the thermoelectric power generation device 1A. As shown in FIG. 4, the thermoelectric power generation system 10 includes: four thermoelectric power generation devices 1A, an inverter 11, and an electric load 12. In the thermoelectric power generation system 10, the four thermoelectric power generation devices 1A are connected in parallel. The four thermoelectric power generation devices 1A connected in parallel are connected to the inverter 11. The inverter 11 is connected to the electric load 12. In the thermoelectric power generation system 10, power generated by the four thermoelectric power generation devices 1A is supplied to the electric load 12 through the inverter 11.

<Heat Medium System>

Figure 5:
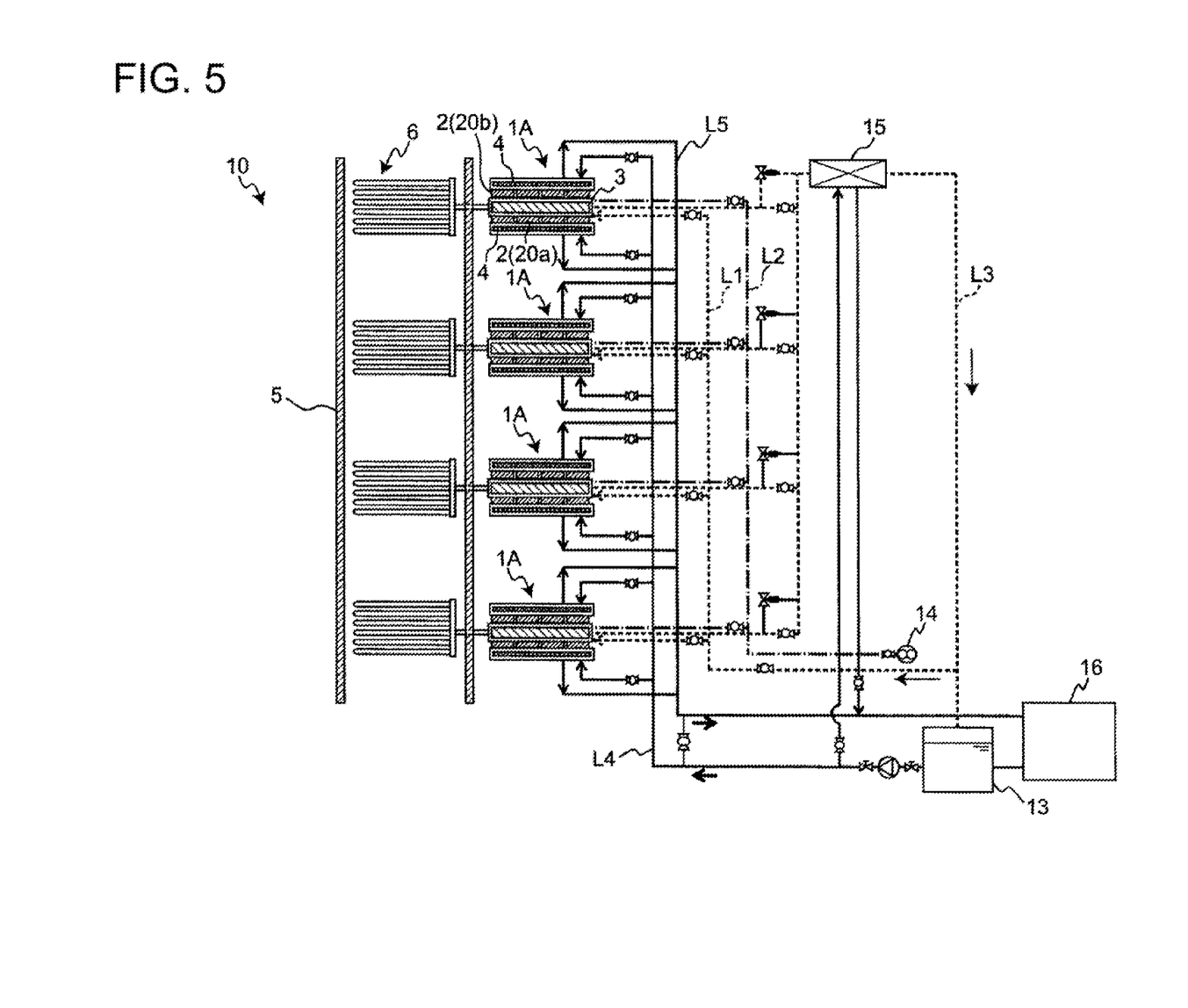
FIG. 5 A schematic diagram of a heat medium system of the thermoelectric power generation system using the thermoelectric power generation device related to Embodiment 1 of the present invention.

FIG. 5 is a schematic diagram of a heat medium system of a thermoelectric power generation system 10 using the thermoelectric power generation device 1A. In FIG. 5, the dotted line and the one dot chain line indicate the line of the heat medium, and the solid line indicates the line of the cooling liquid. First, a flow of the heat medium is described. As shown in FIG. 5, the heat medium lines L 1, L 2, and L 3 are connected to the heating unit 3 of the thermoelectric power generation device 1A. To the heat medium lines L1, L2, and L3, valves are provided respectively. While the heat medium spontaneously circulates inside the heating unit 3, the heat medium lines L1, L2, L3 are closed. The valve provided to the heat medium line L3 is a pressure valve.

The heat medium line L1 is a line for filling water to become the heat medium. To supply the heat medium inside the heating unit 3, the valve of the heat medium line L1 is opened to supply the heat medium from a tank 13 into the heating unit 3, through the heat medium line L1.

The heat medium line L2 is a line for evacuation using a vacuum pump 14. Evacuation is performed by using the vacuum pump 14 through the heat medium line L2, while the heating unit 3 has no heat medium. After the evacuation, the heat medium in the tank 13 is supplied inside the heating unit 3 through the heat medium line L1.

The heat medium line L3 is a line for discharging the heat medium inside the heating unit 3 to the tank 13. When the vapor pressure inside the heating unit 3 becomes higher than the tolerance of the pressure valve of the heat medium line L3, the pressure valve opens and the vapor inside the heating unit 3 is discharged to the heat medium line L3. The heat medium discharged from the heating unit 3 flows in the heat medium line L3, and is discharged to the tank 13 through a heat exchanger 15. Since water is used as the heat medium and as the cooling liquid in Embodiment 1, the cooling liquid and the heat medium can be stored in the tank 13.

Next, a flow of the cooling liquid is described. As shown in FIG. 5, the cooling liquid flows from the tank 13 to the cooling unit 4 through a cooling liquid line L4, by using a pump and the like. The cooling liquid having flowed into the cooling unit 4 flows to a cooling installation 16 through a cooling liquid line L5. The cooling installation 16 is, for example, a cooling tower for cooling the cooling liquid. The cooling liquid cooled in the cooling installation 16 is stored in the tank 13.

[Effects]

The thermoelectric power generation device 1A related to Embodiment 1 brings about the following effects.

The thermoelectric power generation device 1A includes a thermoelectric element 2 which generates power utilizing a temperature difference between a condensation temperature of a heat medium that undergoes latent heat transfer in the heat medium passage of the internal space 7a of the heating unit 3 and the temperature of a cooling liquid. Since the temperature of the heat medium is kept constant by utilizing the latent heat transfer of the heat medium in the structure, the power generation amount can be improved.

Further, the thermoelectric power generation device 1A includes a heat medium adjusting unit 8A configured to adjust the pressure of the heat medium. The heat medium adjusting unit 8A is configured to adjust the pressure so that the pressure in the heat medium passage does not exceed a predetermined upper limit value. This structure can suppress or reduce an excessive increase in the pressure of the heat medium, and suppress or reduce damages to the heat medium passage and the thermoelectric element 2. As a result, the power generation amount can be improved.

The "predetermined upper limit value" of the temperature of the heat medium is set according to a heat resisting temperature of the thermoelectric modules 20a, 20b of the thermoelectric power generation device 1A, in such a manner as to be a temperature lower than the heat resisting temperature, e.g., to the heat resisting temperature of −30° C. Further, the "predetermined upper limit value" of the pressure of the heat medium may be set according to the heat resisting pressure. Where the temperature of the cooling liquid is approximately 30 degrees, the temperature of the heat medium is approximately 150 degrees, and the pressure of the heat medium is approximately 1.1 MPa, for example, a power generation amount of approximately 200 W can be achieved.

It should be noted that Embodiment 1 deals with a thermoelectric power generation system 10 having four thermoelectric power generation devices 1A; however, the present invention is not limited to this, as long as the thermoelectric power generation system 10 includes at least one thermoelectric power generation device 1A.

Although Embodiment 1 adopts water as the heat medium and the cooling liquid, the present invention is not limited to this. The heat medium and the cooling liquid may be different. Any heat medium may be adopted provided that the heat medium can change its phase between gas and liquid in the circulation path 7. Any given liquid may be adopted as a cooling liquid, provided that cooling is possible.

Although Embodiment 1 deals with a case where the thermoelectric element 2 is provided to one side of the heating unit 3, the present invention is not limited to this. For example, the thermoelectric element 2 may be provided on a surface of only one side of the heating unit 3.

Note that Embodiment 1 deals with a case where the valve body 83A is an automatic valve such as a motor operated valve or an electromagnetic valve; however, the present invention is not limited to this. For example, valve body 83 A may be a pressure relief valve that opens when the pressure exceeds a certain pressure. In this case, the need for the pressure detection unit 84A can be eliminated.

Embodiment 2

[Overall Structure]

A thermoelectric power generation device related to Embodiment 2 of the present invention is described. It should be noted that Embodiment 2 mainly describes differences from Embodiment 1. In Embodiment 2, the same symbols are given to structures identical or similar to those of Embodiment 1. Further, the description of Embodiment 2 omits descriptions which overlap with that of Embodiment 1.

Figure 6:
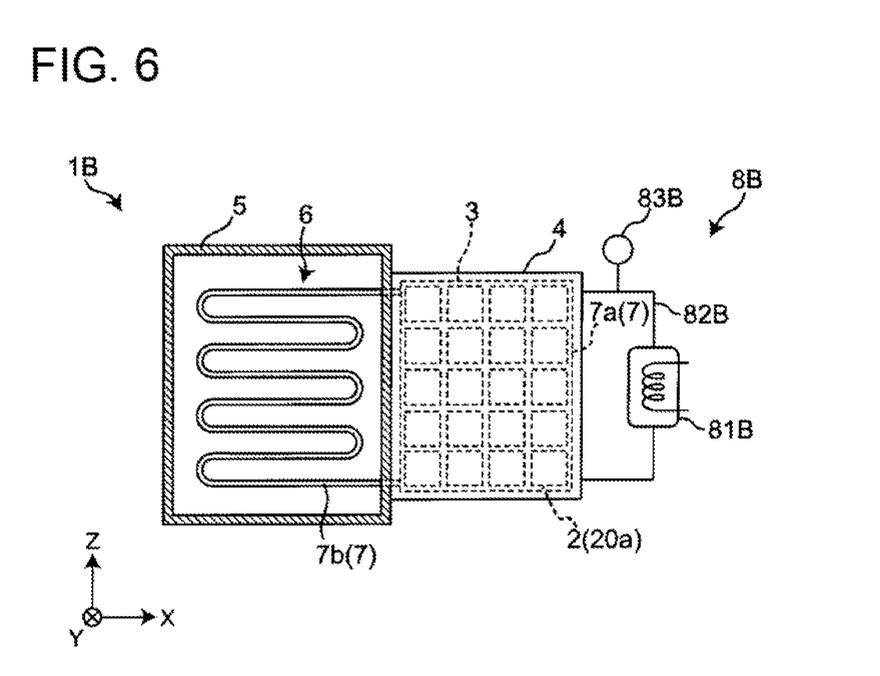
FIG. 6 A diagram showing a schematic structure of a thermoelectric power generation device related to Embodiment 2 of the present invention.

FIG. 6 shows a schematic structure of a thermoelectric power generation device 1B related to Embodiment 2.

Embodiment 2 is different from Embodiment 1 in that a heat medium adjusting unit 8B is provided instead of the heat medium adjusting unit 8A.

The heat medium adjusting unit 8B is configured to reduce the pressure when the pressure in the heat medium passage in the internal space 7a of the heating unit 3 exceeds a predetermined upper limit value. Specifically, as shown in FIG. 6, the heat medium adjusting unit 8B includes a heat exchanger 81B configured to perform heat exchanging with respect to the heat medium; a heat medium pipe 82B connecting the internal space 7a of the heating unit 3 with the heat exchanger 81B; and a pressure detection unit 83B configured to detect the pressure of the heat medium. The pressure detecting unit 83B is, for example, a pressure sensor.

The heat exchanger 81B is configured to perform heat exchanging with respect to the heat medium to reduce the pressure of the heat medium when the pressure detected by the pressure detection unit 83B exceeds a predetermined upper limit value. For example, the heat exchanger 81B includes a cooling liquid passage (not shown) through which a cooling liquid flows and a valve body (not shown) which opens and closes the cooling liquid passage, and is attached to the heat medium pipe 82B. When a pressure detected by the pressure detection unit 83b exceeds a predetermined upper limit value, the heat exchanger 81b opens the valve body to let the cooling liquid flow into the cooling liquid passage. As a result, the heat medium flowing through the heat medium pipe 82B is cooled, and the pressure of the heat medium is reduced. Note that the operation of the heat medium adjusting unit 8B is controlled by a not-shown control unit.

[Effects]

The thermoelectric power generation device 1B related to Embodiment 2 brings about the following effects.

With the thermoelectric power generation device 1B, the pressure of the heat medium can be more directly reduced by the heat exchanger 81B. Therefore, an excessive increase in the pressure of the heat medium can be more reliably suppressed or reduced, and damages to the heat medium passage and the thermoelectric element 2 can be suppressed or reduced. As a result, the power generation amount can be improved.

Further, as described above, since the pressure of the heat medium has a proportional relation with the temperature of the heat medium, the heat medium adjusting unit 8B may be configured to reduce the temperature of the heat medium when the temperature in the heat medium passage in the internal space 7a of the heating unit 3 exceeds a predetermined upper limit value. Specifically, the heat medium adjusting unit 8B may include a temperature detection unit that detects the temperature of the heat medium instead of the pressure detection unit 83B. In this case, the heat exchanger 81B may be configured to perform heat exchanging with respect to the heat medium to reduce the temperature of the heat medium when the temperature detected by the temperature detection unit exceeds a predetermined upper limit value.

Embodiment 3

[Overall Structure]

A thermoelectric power generation device related to Embodiment 3 of the present invention is described. It should be noted that Embodiment 3 mainly describes differences from Embodiment 1. In Embodiment 3, the same symbols are given to structures identical or similar to those of Embodiment 1. Further, the description of Embodiment 3 omits descriptions which overlap with that of Embodiment 1.

Figure 7:
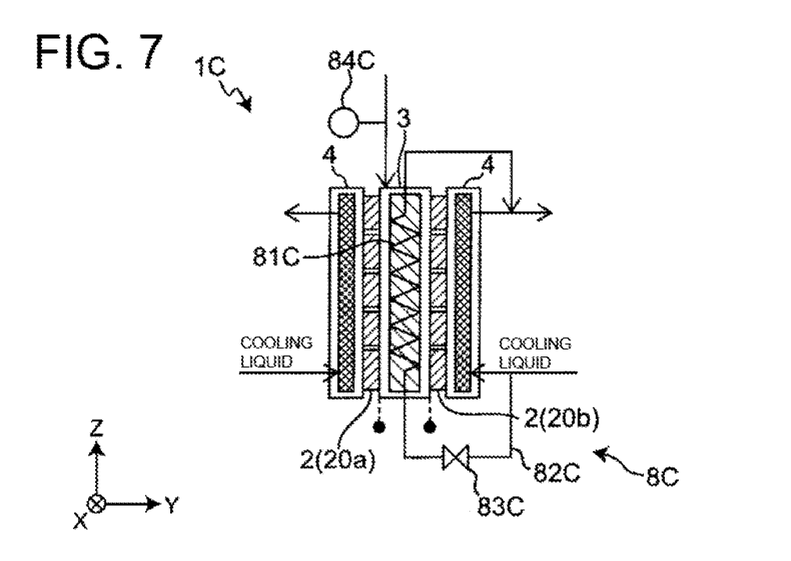
FIG. 7 A diagram showing a schematic structure of the thermoelectric power generation device related to Embodiment 3 of the present invention as viewed from behind.

FIG. 7 is a diagram showing a schematic structure of the thermoelectric power generation device 1C related to Embodiment 3 as viewed from behind (in the X direction).

Embodiment 3 is different from Embodiment 1 in that a heat medium adjusting unit 8C is provided instead of the heat medium adjusting unit 8A.

The heat medium adjusting unit 8C is configured to reduce the pressure of the heat medium when the pressure in the heat medium passage in the internal space 7a of the heating unit 3 exceeds a predetermined upper limit value. Specifically, the heat medium adjusting unit 8C includes: a cooling pipe 81C passing through the heating unit 3; a branch pipe 82C branching from the cooling liquid inflow pipe 41 (see FIG. 3) and connecting to the cooling pipe 81C; a valve body 83C that opens and closes the branch pipe 82C; and a pressure detection unit 84C configured to detect the pressure of the heat medium. The valve body 83C is an automatic valve such as an electrically driven motor operated valve or an electromagnetic valve. The pressure detection unit 84A is, for example, a pressure sensor.

When the pressure detected by the pressure detection unit 84C exceeds a predetermined upper limit value, the heat medium adjusting unit 8C opens the valve body 83C to let the cooling liquid partially flow as the coolant into the cooling pipe 81C through the branch pipe 82C, thereby reducing the pressure in the heat medium passage. Note that the operation of the heat medium adjusting unit 8C is controlled by a not-shown control unit.

[Effects]

The thermoelectric power generation device 1C related to Embodiment 3 brings about the following effects.

The thermoelectric power generation device 1C is configured to reduce the pressure of the heat medium by letting the cooling liquid partially flow as a coolant into the cooling pipe 81C passing through the heating unit 3. This structure can more reliably suppress or reduce an excessive increase in the pressure of the heat medium, and suppress or reduce damages to the heat medium passage and the thermoelectric element 2. As a result, the power generation amount can be improved. Further, there is no need to provide the heat exchanger 81B as in the case of Embodiment 2 described hereinabove. Further, since the part of the cooling liquid flowing into the cooling liquid passage 40 of the cooling unit 4 is used as the coolant, there is no need of separately preparing a coolant to reduce the pressure of the heat medium.

Further, as described above, since the pressure of the heat medium has a proportional relation with the temperature of the heat medium, the heat medium adjusting unit 8C may be configured to reduce the temperature of the heat medium when the temperature in the heat medium passage in the internal space 7a of the heating unit 3 exceeds a predetermined upper limit value. Specifically, the heat medium adjusting unit 8C may include a temperature detection unit that detects the temperature of the heat medium instead of the pressure detection unit 84C. In this case, the heat exchanger 81B may be configured to let the cooling liquid partially flow into the cooling pipe 81C passing through the heating unit 3 to reduce the temperature of the heat medium when the temperature detected by the temperature detection unit exceeds a predetermined upper limit value.

For example, the cooling pipe 81C is preferably configured in a coil shape so as to meander inside the heating unit 3. This structure increases the contact area between the heating unit 3 and the cooling pipe 81C. Therefore, the cooling efficiency can be improved.

Embodiment 4

[Overall Structure]

A thermoelectric power generation device related to Embodiment 4 of the present invention is described. It should be noted that Embodiment 4 mainly describes differences from Embodiment 1. In Embodiment 4, the same symbols are given to structures identical or similar to those of Embodiment 1. Further, the description of Embodiment 4 omits descriptions which overlap with that of Embodiment 1.

Figure 8:
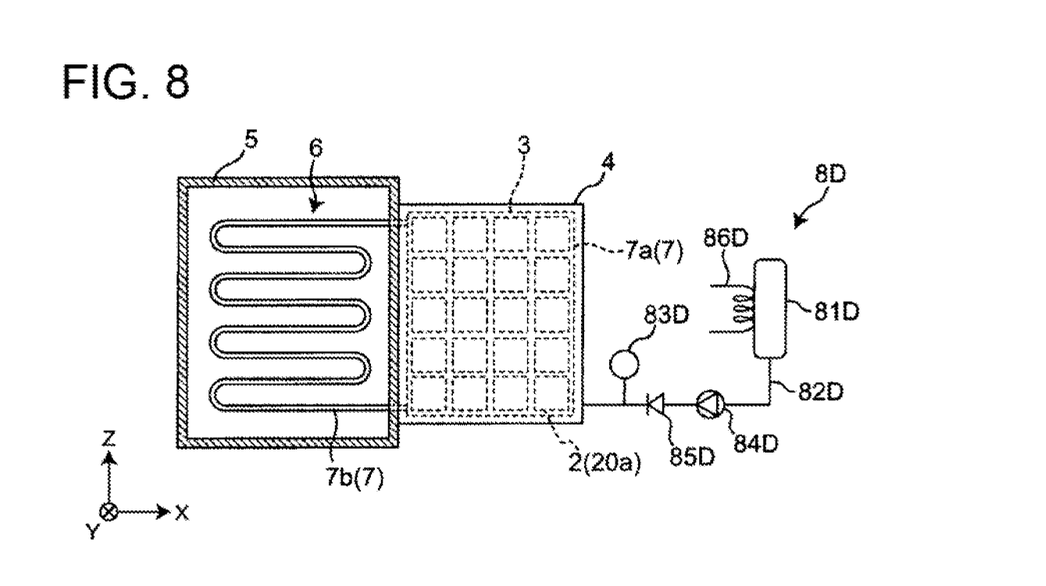
FIG. 8 A diagram showing a schematic structure of a thermoelectric power generation device related to Embodiment 4 of the present invention.

FIG. 8 shows a schematic structure of a thermoelectric power generation device 1D related to Embodiment 4.

Embodiment 4 is different from Embodiment 1 in that a heat medium adjusting unit 8D is provided instead of the heat medium adjusting unit 8A.

The heat medium adjusting unit 8D is configured to adjust the pressure of the heat medium in the heat medium passage in the internal space 7a of the heating unit 3, so that the pressure of the heat medium does not fall short of a predetermined lower limit value. Specifically, the heat medium adjusting unit 8D includes: a heat medium storage tank 81D for storing the heat medium; a heat medium pipe 82D for connecting the heat medium passage and the heat medium storage tank 81D; and a pressure detection unit 83D for detecting the pressure of the heat medium. The pressure detecting unit 83D is, for example, a pressure sensor.

The heat medium adjusting unit 8D is configured to let the heat medium in the heat medium storage tank 81D flow into the heat medium passage through the heat medium pipe 82D, so that the pressure detected by the pressure detection unit 83D does not fall short of the predetermined lower limit value. Note that, the heat medium passage is sealed except for the connection part. Therefore, when the heat medium in the heat medium storage tank 81D flows into the heat medium passage, the amount of the heating medium filled and flowing through the heat medium passage is increased, and the pressure of the heat medium passage is increased.

In Embodiment 4, the heat medium adjusting unit 8D further includes a pump 84D configured to pressure-feed the heating medium in the heat medium storage tank 81D to the heat medium passage. This pump 84D allows the heat medium in the heat medium storage tank 81D to flow into the heat medium passage. Further, the heat medium pipe 82D has a check valve 85D which restricts a flow of the heat medium from the heat medium passage to the heat medium storage tank 81D, while allowing a flow of the heat medium from the heat medium storage tank 81D to the heat medium passage. The check valve 85D suppresses or reduces the heat medium from flowing back into the heat medium storage tank 81D at an unintended timing.

Further, the heat medium adjusting unit 8D further includes a heater 86D for heating the heat medium stored in the heat medium storage tank 81D. The heater 86D heats the heat medium stored in the heat medium storage tank 81D so that the pressure of the heat medium stored in the heat medium storage tank 81D is higher than the pressure of the heat medium in the heat medium passage. This allows the heat medium in the heat medium storage tank 81D to reliably flow into the heat medium passage. The heater 86D is not particularly limited as long as it can heat the heat medium. For example, the heater 86D may be a burner or a heater. Note that the operation of the heat medium adjusting unit 8D is controlled by a not-shown control unit.

[Effects]

The thermoelectric power generation device 1D related to Embodiment 4 brings about the following effects.

The thermoelectric power generation device 1D is configured to let the heat medium in the heat medium storage tank 81D flow into the heat medium passage, so that the pressure in the heat medium passage in the internal space 7a of the heating unit 3 does not fall short of the predetermined lower limit value. This structure can suppress or reduce an excessive decrease in the pressure of the heat medium, to maintain the condensation pressure of the heat medium, and to achieve a sufficient temperature difference between both surfaces of the thermoelectric element 2. As a result, the power generation amount can be improved.

Further, for example, the pressure of the heat medium is usually low immediately after driving of the thermoelectric power generation device 1D is started. In this regard, the thermoelectric power generation device 1D can promote an increase in the pressure of the heat medium. Therefore, the power generation amount can be improved.

It should be noted that an excessive increase in the pressure of the heat medium may damage the heat medium passage or the thermoelectric element 2 to the extent that recovery of the original state is not possible. For this reason, the pressure of the heat medium is preferably brought down immediately, when the pressure in the heat medium passage exceeds the predetermined upper limit value. To the contrary, an excessive drop in the pressure of the heat medium does not damage the heat medium passage or the thermoelectric element 2. Therefore, the pressure of the heat medium may be brought up, when the pressure in the heat medium passage falls short of the predetermined lower limit value for a certain period of time.

As described above, since the pressure of the heat medium has a proportional relation with the temperature of the heat medium, the heat medium adjusting unit 8D may be configured to adjust the temperature of the heat medium so that the temperature in the heat medium passage in the internal space 7a of the heating unit 3 does not fall short of a predetermined lower limit value. Specifically, the heat medium adjusting unit 8D may include a temperature detection unit that detects the temperature of the heat medium instead of the pressure detection unit 83D. In this case, for example, the heat medium adjusting unit 8D may be configured to let the heat medium in the heat medium storage tank 81D flow into the heat medium passage through the heat medium pipe 82D, so that the temperature detected by the temperature detection unit does not fall short of the predetermined lower limit value.

In Embodiment 4, although the heat medium adjusting unit 8D includes the pump 84d and the heater 86D, the present invention is not limited to this. The heat medium adjusting unit 8D may include only one of the pump 84D and the heater 86D, as long as it can cause the heat medium in the heat medium storage tank 81D to flow into the heat medium passage.

Embodiment 5

[Overall Structure]

A thermoelectric power generation device related to Embodiment 5 of the present invention is described. It should be noted that Embodiment 5 mainly describes differences from Embodiment 1. In Embodiment 5, the same symbols are given to structures identical or similar to those of Embodiment 1. Further, the description of Embodiment 5 omits descriptions which overlap with that of Embodiment 1.

Figure 9:
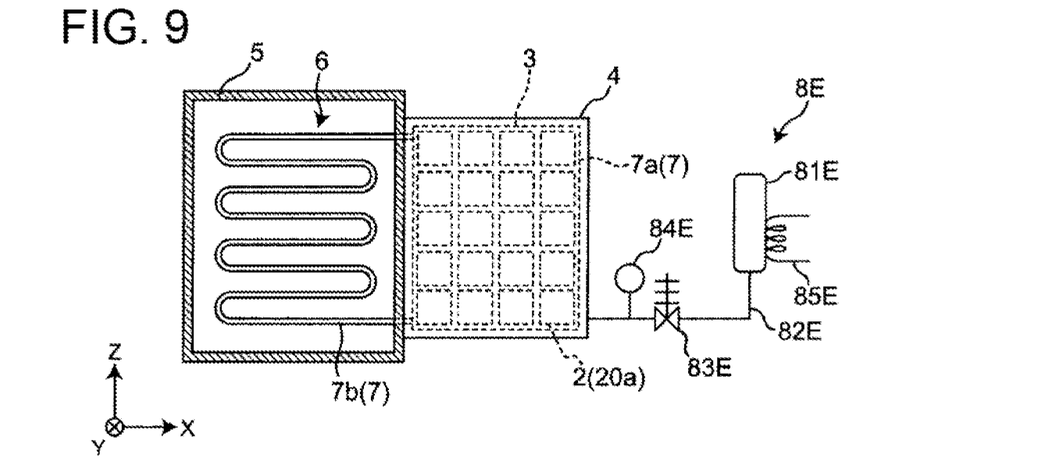
FIG. 9 A diagram showing a schematic structure of a thermoelectric power generation device related to Embodiment 5 of the present invention.

FIG. 9 shows a schematic structure of a thermoelectric power generation device 1E related to Embodiment 5.

Embodiment 5 is different from Embodiment 1 in that a heat medium adjusting unit 8E is provided instead of the heat medium adjusting unit 8A.

The heat medium adjusting unit 8E is configured to adjust the pressure of the heat medium in the heat medium passage in the internal space 7a of the heating unit 3, so that the pressure of the heat medium does not fall short of a predetermined lower limit value. Specifically, the heat medium adjusting unit 8E includes: a heat medium storage tank 81E for storing the heat medium, a heat medium pipe 82A connecting the heat medium passage and the heat medium storage tank 81E; a valve body 83E configured to open and close the heat medium pipe 82E; and a pressure detection unit 84E for detecting the pressure of the heat medium. The valve body 83E is an automatic valve such as an electrically driven motor operated valve or an electromagnetic valve. The pressure detecting unit 84E is, for example, a pressure sensor.

The heat medium adjusting unit 8E is configured to open the valve body 83E to let the heat medium in the heat medium storage tank 81E flow into the heat medium passage through the heat medium pipe 82E, so that the pressure detected by the pressure detection unit 84E does not fall short of the predetermined lower limit value. Note that, the heat medium passage is sealed except for the connection part. Therefore, when the heat medium in the heat medium storage tank 81E flows into the heat medium passage, the amount of the heating medium filled and flowing through the heat medium passage is increased, and the pressure of the heat medium passage is increased.

Further, the heat medium adjusting unit 8E further includes a heater 85E for heating the heat medium stored in the heat medium storage tank 81E. The heater 85E heats the heat medium stored in the heat medium storage tank 81E so that the pressure of the heat medium stored in the heat medium storage tank 81E is higher than the pressure of the heat medium in the heat medium passage. This allows the heat medium in the heat medium storage tank 81E to reliably flow into the heat medium passage. Note that the operation of the heat medium adjusting unit 8E is controlled by a not-shown control unit.

[Effects]

The thermoelectric power generation device 1E related to Embodiment 5 brings about the following effects.

The thermoelectric power generation device 1E is configured to let the heat medium in the heat medium storage tank 81E flow into the heat medium passage, so that the pressure in the heat medium passage in the internal space 7a of the heating unit 3 does not fall short of the predetermined lower limit value. This structure can suppress or reduce an excessive decrease in the pressure of the heat medium, to maintain the condensation pressure of the heat medium, and to achieve a sufficient temperature difference between both surfaces of the thermoelectric element 2. As a result, the power generation amount can be improved.

As described above, since the pressure of the heat medium has a proportional relation with the temperature of the heat medium, the heat medium adjusting unit 8E may be configured to adjust the temperature of the heat medium so that the temperature in the heat medium passage in the internal space 7a of the heating unit 3 does not fall short of a predetermined lower limit value. Specifically, the heat medium adjusting unit 8E may include a temperature detection unit that detects the temperature of the heat medium instead of the pressure detection unit 84E. In this case, for example, the heat medium adjusting unit 8E may be configured to let the heat medium in the heat medium storage tank 81E flow into the heat medium passage through the heat medium pipe 82E, so that the temperature detected by the temperature detection unit does not fall short of the predetermined lower limit value.

The heat medium adjusting unit 8E, as in the heat medium adjusting unit 8A related to Embodiment 1, may be configured to adjust the pressure so that the pressure in the heat medium passage does not exceed the predetermined upper limit value. In other words, the heat medium adjusting unit 8E reduces the pressure of the heat medium in the heat medium storage tank 81E to a pressure lower than the pressure of the heat medium in the heat medium passage, instead of heating the heat medium in the heat medium storage tank 85E by the heater 81E. For example, the pressure of the heat medium is usually low, and in such a state, immediately after driving of the thermoelectric power generation device 1E is started. Then, the heat medium adjusting unit 8E may be configured to open the valve body 83E to let the heat medium in the heat medium passage partially flow out into the heat medium storage tank 81E through the heat medium pipe 82E, so that the pressure detected by the pressure detection unit 84E does not exceed a predetermined upper limit value. This structure can suppress or reduce both an excessive increase and an excessive drop in the pressure of the heat medium, thereby further improving the power generation amount.

Note that Embodiment 5 deals with a case where the valve body 83E is an automatic valve such as a motor operated valve or an electromagnetic valve; however, the present invention is not limited to this. For example, the valve body 83E may be a pressure relief valve that opens when the pressure exceeds a certain pressure. In this case, the need for the pressure detection unit 84E can be eliminated.

It should be noted that the effects of the embodiments described above can be brought about by suitably combining any of the various embodiments described above.

Although each of the above embodiments describes the present invention with a certain level of details, the details of the structures disclosed in these embodiments are modifiable. Further, modification in combinations and arrangement of elements in each embodiment are possible without departing from the scope and spirit of the present disclosure.

INDUSTRIAL APPLICABILITY

Since the present invention is capable of improving the power generation amount, the present invention is useful for a thermoelectric power generation device which generates power by utilizing the heat of a high temperature fluid flowing in an exhaust gas duct and the like of an engine.

REFERENCE SIGNS LIST 1A, 1B, 1C, 1D, 1E thermoelectric power generation device
10 thermoelectric power generation system
11 inverter
12 electric load
13 tank
14 vacuum pump
15 heat exchanger
16 cooling installation
2 thermoelectric element
20a, 20b thermoelectric module
3 heating unit
4 cooling unit
40 cooling liquid passage
41 cooling liquid inflow pipe
42 cooling liquid discharge pipe
5 passage
6 heat transfer pipe
61 tubular member
62 bent portion
63, 64 open end portion
7 circulation path 7a, 7b internal space
8A, 8B, 8C, 8D, 8E heat medium adjusting unit
81A heat medium storage tank
82A heat medium pipe
83A valve body
84A pressure detection unit
81B heat exchanger
82B heat medium pipe
83B pressure detection unit
81C cooling pipe
82C branch pipe
83C valve body
84C pressure detection unit
81D heat medium storage tank
82D heat medium pipe
83D pressure detection unit
84D pump
85D check valve
86D heater
81E heat medium storage tank
82E heat medium pipe
83E valve body
84E pressure detection unit
85E heater
L1, L2, L3 heat medium line
L4, L5 cooling liquid line

The invention claimed is:

1. A thermoelectric power generation device comprising:
a heating unit having a heat medium passage in which a heat medium is configured to flow;
a cooling unit having a cooling liquid passage in which a cooling liquid is configured to flow;
a thermoelectric element having the heating unit on one side thereof and the cooling unit on another side thereof, the thermoelectric element configured to generate power by utilizing a temperature difference between a condensation temperature of the heat medium that undergoes latent heat transfer in the heat medium passage and a temperature of the cooling liquid; and
a heat medium adjusting unit configured to adjust a pressure or a temperature of the heat medium passage such that the pressure or the temperature in the heat medium passage is greater than or equal to a lower limit value, the heat medium adjusting unit comprising:
a heat medium storage tank configured to store the heat medium; and
a heater configured to heat the heat medium stored in the heat medium storage tank.

2. The thermoelectric power generation device according to claim 1, wherein the heat medium adjusting unit is configured to adjust the pressure or the temperature in the heat medium passage, so that the pressure or the temperature in the heat medium passage does not exceed an upper limit value.

3. The thermoelectric power generation device according to claim 2, wherein:
the heat medium adjusting unit comprises:
a heat medium pipe connecting the heat medium passage with the heat medium storage tank,
a valve body configured to open and close the heat medium pipe, and
a pressure detection unit configured to detect the pressure of the heat medium or a temperature detection unit configured to detect the temperature of the heat medium; and
the heat medium adjusting unit is configured to open the valve body to let the heat medium in the heat medium passage partially flow into the heat medium storage tank, so that the pressure detected by the pressure detection unit or the temperature detected by the temperature detection unit is less than or equal to the upper limit value.

4. The thermoelectric power generation device according to claim 1, wherein:
the heat medium adjusting unit comprises a heat exchanger configured to perform heat exchanging with respect to the heat medium; and
the heat exchanger is configured to perform heat exchanging with respect to the heat medium to reduce the pressure or the temperature of the heat medium when the pressure or the temperature in the heat medium passage is greater than an upper limit value.

5. The thermoelectric power generation device according to claim 1, wherein the heat medium adjusting unit comprises a cooling pipe passing through the heating unit, and is configured to reduce the pressure or the temperature in the heat medium passage by letting a coolant flow into the cooling pipe when the pressure or the temperature in the heat medium passage is greater than an upper limit value.

6. The thermoelectric power generation device according to claim 5, wherein:
the heat medium adjusting unit comprises:
a branch pipe branching from a cooling liquid inflow pipe through which the cooling liquid is introduced into the cooling liquid passage,
a valve body configured to open and close the branch pipe, and
a pressure detection unit configured to detect the pressure of the heat medium or a temperature detection unit configured to detect the temperature of the heat medium; and
the heat medium adjusting unit is configured to open the valve body to let the cooling liquid partially flow as the coolant through the branch pipe into the cooling pipe when a pressure detected by the pressure detection unit or the temperature detected by the temperature detection unit is greater than the upper limit value.

7. The thermoelectric power generation device according to claim 1, wherein:
the heat medium adjusting unit comprises:
a heat medium pipe connecting the heat medium passage with the heat medium storage tank, and
a pressure detection unit configured to detect the pressure of the heat medium or a temperature detection unit configured to detect the temperature of the heat medium; and
the heat medium adjusting unit is configured to let the heat medium in the heat medium storage tank flow into the heat medium passage through the heat medium pipe, so that the pressure detected by the pressure detection unit or the temperature detected by the temperature detection unit is greater than or equal to the lower limit value.

8. The thermoelectric power generation device according to claim 7, wherein the heat medium adjusting unit comprises a pump configured to pressure-feed the heat medium in the heat medium storage tank to the heat medium passage.

9. The thermoelectric power generation device according to claim 1, wherein:
the heat medium adjusting unit comprises:
a heat medium pipe connecting the heat medium passage with the heat medium storage tank, a valve body configured to open and close the heat medium pipe, and a pressure detection unit configured to detect the pressure of the heat medium or a temperature detection unit configured to detect the temperature of the heat medium; and the heat medium adjusting unit is configured to open the valve body to let the heat medium in the heat medium storage tank flow into the heat medium passage through the heat medium pipe, so that the pressure detected by the pressure detection unit or the temperature detected by the temperature detection unit is greater than or equal to the lower limit value.

10. The thermoelectric power generation device according to claim 7, wherein the heater is configured to heat the heat medium so that the pressure or the temperature of the heat medium stored in the heat medium storage tank is higher than the pressure or the temperature in the heat medium passage.

11. The thermoelectric power generation device according to claim 1, wherein the heat medium adjusting unit further comprises a heat medium pipe connecting the heat medium passage with the heat medium storage tank.

12. The thermoelectric power generation device according to claim 11, wherein the heat medium adjusting unit further comprises a pressure detection unit configured to detect the pressure of the heat medium or a temperature detection unit configured to detect the temperature of the heat medium.

13. The thermoelectric power generation device according to claim 1, wherein the heat medium adjusting unit further comprises a pressure detection unit configured to detect the pressure of the heat medium or a temperature detection unit configured to detect the temperature of the heat medium.

14. The thermoelectric power generation device according to claim 2, wherein the upper limit value is based on a heat resisting temperature of the thermoelectric element.

* * * * *